United States Patent [19]

Lee et al.

[11] Patent Number: 4,860,232
[45] Date of Patent: Aug. 22, 1989

[54] DIGITAL TECHNIQUE FOR PRECISE MEASUREMENT OF VARIABLE CAPACITANCE

[75] Inventors: Hae-Seung Lee, Watertown; Roger T. Howe, Belmont; Joseph T. Kung, Cambridge, all of Mass.

[73] Assignee: Massachusetts Institute of Technology, Cambridge, Mass.

[21] Appl. No.: 41,773

[22] Filed: Apr. 22, 1987

[51] Int. Cl.$^4$ .................................................. G01R 27/26
[52] U.S. Cl. ............................... 364/571.04; 73/718; 73/724; 324/60 C
[58] Field of Search ................. 73/718, 724, 760, 763, 73/777, 780; 324/60 C, 60 R, 61 R; 364/558, 571, 571.04

[56] References Cited

U.S. PATENT DOCUMENTS

| | | | |
|---|---|---|---|
| 4,322,977 | 4/1982 | Sell et al. | 73/724 X |
| 4,434,664 | 3/1984 | Antonazzi | 73/718 X |
| 4,644,798 | 2/1987 | Tamura et al. | 73/724 X |
| 4,716,361 | 12/1987 | Sheffer | 324/60 C X |
| 4,724,709 | 2/1988 | Antonazzi, Sr. et al. | 73/724 X |
| 4,751,654 | 6/1988 | Lyyra | 364/571.04 X |

OTHER PUBLICATIONS

Y. E. Park and K. D. Wise, an MOS Switched-Capacitor Readout Amplifier for Capacitive Pressure Sensors, "*Proceedings of the 1983 Custom Integrated Circuits Conference,*" Rochester, N.Y., May 23–25, 1983.

Masakazu Furukawa, Hidetoshi Hatano, and Koji Hanihara, "Precision Measurement Technique of Integrated MOS Capacitor Mismatching using a Simple On-Chip Circuit," *IEEE Transactions on Electron Devices,* vol. Ed-33, No. 7, Jul. 1986.

Hae-Seung Lee, David A. Hodges, Paul R. Gray, "A Self-Calibrating 15-Bit CMOS A/D Converter," *IEEE Journal of Solid-State Circuits,* vol. SC-19, No. 6, Dec. 1984.

James L. McCreary and Paul R. Gray, "All-MOS Charge Redistribution Analog-To-Digital Conversion Techniques—Part I," *IEEE Journal of Solid State Circuits,* vol. SC. 10, No. 6, Dec. 1976, pp. 371–379.

Ricardo E. Suarez, Paul R. Gray and David A. Hodges, "All-MOS Charge Redistribution Analog-To-Digital Conversion Techniques—Part II," *IEEE Journal of Solid State Circuits,* vol. SC. 10, No. 6, Dec. 1975, pp. 379–385.

James L. McCreary and David A. Sealer, "Precision Capacitor Ratio Measurement Technique for Integrated Circuit Capacitor Arrays," *IEEE Transactions on Instrumentation and Measurement,* vol. IM-28, No. 1, Mar. 1979, pp. 11–17.

*Primary Examiner*—Parshotam S. Lall
*Assistant Examiner*—Edward R. Cosimono
*Attorney, Agent, or Firm*—Hamilton, Brook, Smith & Reynolds

[57] ABSTRACT

The present invention comprises a circuit for measuring the capacitive differences of small capacitors. The circuit comprises a reference capacitor and a sensor capacitor. Connected to one of the plates of each capacitor is a switch which connects the capacitors to one of two reference voltages. The other plate of the capacitors are connected to an input terminal of a voltage comparator. The comparator compares the input voltage with a third reference voltage. Differences in voltages detected by the comparator are applied to a feedback loop for generating an offset voltage at the input terminal. The offset voltage applied at the input terminal is proportional to the capacitive difference between the reference capacitor and the sensor capacitor. The feedback loop comprises a successive approximation register for digitizing the offset voltages and a digital to analog converter for converting the digitized voltages into analog voltages which are applied at the input terminal. Digitized offset voltages can be measured at the output of the successive approximation register.

38 Claims, 3 Drawing Sheets

DIGITAL TECHNIQUE FOR PRECISE MEASUREMENT OF VARIABLE CAPACITANCE

BACKGROUND OF THE INVENTION

Since the introduction of the first microprocessor in the early 1970's, the increased demand for faster and smaller digital processing elements has spurred the rapid growth of digital technology. Large thrusts were made to make this industry both innovative and economical. Today, there are hosts of devices that operate in the digital domain: static and dynamic memories, EPROM's, PAL's, microprocessors and controllers as well as gate-arrays and ASIC's (Application Specific Integrated Circuits). The cost and turn-around time for producing some of these chips is very small.

There still remains a desire to produce faster and smaller digital chips, but the technology has yet to be discovered that will extend the range of these devices beyond their current capability. Since the availability of memory and microprocessors is abundant, efforts are being made to update interface technology. Data must be in digital form, hence the need for fast and efficient analog-to-digital converters as well as digital-to-analog converters. These comprise the information interface to the real world. In addition to the digital processing and data conversion elements, there is a need for more efficient and innovative sensors. Just as the digital industry sought more creative, cheaper designs, the analog and sensor designers did also.

The efforts of the digital industry made possible the complicated processing of silicon into an economically attractive technology. This industry has dictated the direction of both analog circuit and sensor designers. If a design can be implemented using conventional digital IC technology or by a slight modification, then it is advantageous to do so. This trend can be observed in the frequent use of CMOS technology in analog circuit design, though its origins were in digital design. In this decade, sensor designers have taken advantage of some of the unique processing aspects of silicon. The ability to precisely etch silicon into diaphragms and other structures makes possible total integration of sensor, interface, and information processing on one chip. The economic advantages of system integration are enormous.

A common type of sensor is the variable capacitance device. Capacitance of a capacitor is equal to $\epsilon A/d$ where $\epsilon$ is the dielectric constant, A is the area of the plates, and d is the gap thickness. Any change or combination of changes in the three variables can cause a capacitance change that can be detected. As an example, a pressure transducer can be formed by a diaphragm which supports one plate of the capacitor. Movement of the diaphragm changes the gap of the capacitor and thus its capacitance. As another example, shear force can be detected by lateral movement of one plate relative to another. That movement can vary the effective area of the capacitor. Further, the dielectric constant can be modified by chemical or thermal conditions or the like. Other capacitive sensors can detect tactile pressure or acceleration.

Unfortunately, sophisticated read-out circuitry must be employed to detect small capacitance changes in small capacitors due to the presence of large parasitic capacitances. The challenge is to design circuitry that is compatible with regular MOS fabrication and silicon micromachining processes and which can overcome the problems of parasitics and noise. Present systems employ both ac and dc techniques to sense capacitance change. However, the sense capacitors employed are much greater than the stray parasitics. As silicon diaphragms are scaled, new circuitry must be developed to handle smaller sense capacitors. This is due to the ability of semiconductor processes to scale horizontally across a wafer. If a structure can be built and be operational on a smaller scale, then it is more economical to do so since the cost of processing depends on area.

DISCLOSURE OF THE INVENTION

The present invention relates to a system for sensing a parameter which causes a change in capacitance of a sensing capacitor. The system described incorporates an analog-to-digital converter in the capacitance sensor to provide a direct digital output. The system may avoid errors which might result from parasitic capacitances, amplifier voltage offset, injected charge and charge hysteresis.

The system uses a charge redistribution technique to sense capacitance. A definite amount of charge is isolated on a node which is electrically coupled to the sensing capacitor. The distribution of that charge on the node is then modified by at least one voltage applied to the sensing capacitor. Voltage change with the redistribution of charge is sensed by a comparator which is part of a successive approximation analog to digital converter loop. By means of that loop, a feedback signal is applied to the comparator.

In a preferred system, both a reference capacitor and sensing capacitor are coupled to the node. An analog output from the successive approximation loop is also coupled to the node through a coupling capacitor. The node is connected to the inverting input of the comparator. A charge is sampled by applying a first set of voltages to the reference and sensing capacitors as a switch connected in parallel with the comparator is closed. The resultant charge on the capacitors is isolated as the switch is opened. The voltages applied to the reference and sense capacitors are changed to modify the distribution of the isolated charge and any difference between the capacitances of the two capacitors results in a change in voltage on the node. That change in voltage is then nulled by the successive approximation loop.

Many measurement sequences in which voltages are applied to the capacitors are possible. In many cases, it is preferable to establish the charge on the node with the voltage briefly applied to the sensing capacitor. Thereafter, the voltage applied to the sensing capacitor during the successive approximation routine may be best set at zero to minimize changes in the voltage during the routine. In some systems, both the reference and sensing capacitor may respond to the sensed parameter for a differential output. It may be desirable to apply voltages other than zero to the capacitors to establish the isolated charge and thereafter apply zero volts to both capacitors during the successive approximation routine.

A significant aspect of the system is the ability to calibrate the circuit to avoid errors due, for example, to charge injected by the isolating switch. To that end, the charge may be established on the node and the switch may then be opened without changing the voltages applied to the capacitors on the node. The voltage which then occurs on the node, which may result from charge injected by opening the switch, can then be measured by the successive approximation loop in nulling the voltage. A calibration signal can then be stored digitally and subsequently be applied to the coupling capacitor as charge is established on the node in subsequent measurements. That charge established on the node directly offsets the charge subsequently injected by the switch. Mismatch between the sensing and reference capacitors can be corrected in a similar manner.

Other errors may result from hysteresis of the reference and sense capacitors. That hysteresis can be measured by modifying the distribution of charge in dual sequences. The difference between changes in voltage on the node during the two sequences can be indicative of capacitance hysteresis.

Although the invention may be applied to many forms of capacitance sensors, a novel sensor structure has been developed for pressure sensing. In that sensor, the sensing capacitor is formed of a diaphragm having a conductive plate which spans a gap of a first area. A reference capacitor is formed of a plurality of diaphragms spanning respective gaps. Each gap of the reference capacitor diaphragm is of an area substantially less than of the area of the sensing capacitor diaphragm. Each diaphragm has a conductive plate and the plural plates are electrically coupled to electrically match the sensing capacitor.

BRIEF DESCRIPTION OF THE DRAWINGS

The foregoing and other objects, features, and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention relates to an electronic circuit which measures the change in capacitance of a sensing capacitor. The overall circuit produces an output in both digital and analog forms which is proportional to the capacitance change. Further, the output is free from errors caused by the effects of parasitic capacitance and may be made free of errors such as those resulting from charge injection from MOS switches.

Figure 1:
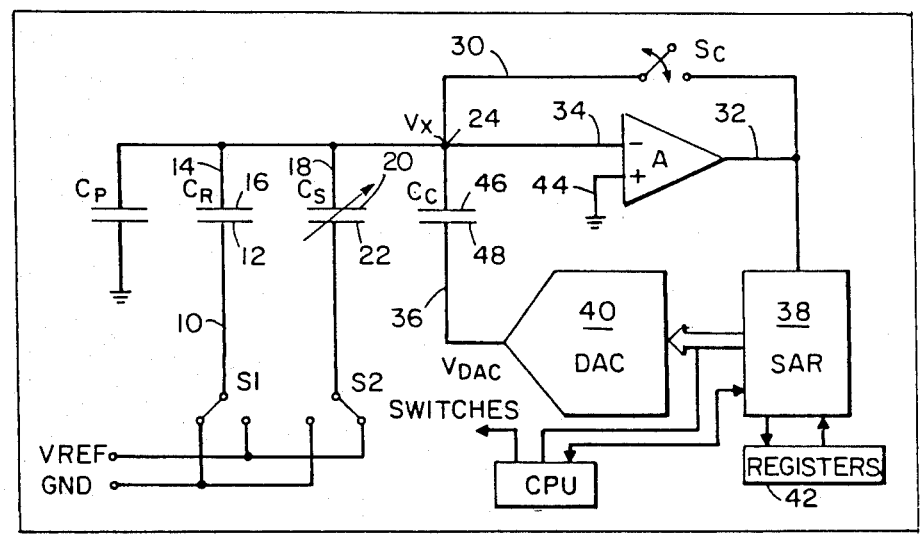
FIG. 1 is a circuit diagram for measuring the change in capacitance of a capacitive sensor embodying the present invention.

A preferred method for measuring the change in capacitance of a capacitive pressure sensor can be explained by making reference to the circuit shown in FIG. 1. The method essentially comprises two steps. For the first step, a first switch $S_1$ is positioned to connect ground GND to an electrode 10 attached to the bottom plate 12 of a reference capacitor $C_R$. An electrode 14 connected to the top plate 16 of the reference capacitor $C_R$ is connected through line 30 to the amplifier output by a coupling switch $S_C$. A sensor capacitor $C_S$ having an electrode 18 attached to its top plate 20 is also connected to the amplifier output by the coupling switch $S_C$. The bottom plate 22 of the sensor capacitor $C_S$ is similarly connected to a reference volta $V_{REF}$ by a second switch $S_2$. A top plate 46 of a coupling capacitor $C_C$ is also coupled to the node 24. The bottom plate 48 of the coupling capacitor $C_C$ is connected to a variable voltage source on line 36, $V_{VAR}=V_{DAC}$, initially set at zero volts. As a result of these connections, a charge $Q_1$ will be stored on the sensing capacitor $C_S$. Note that the voltage $V_X$ at node 24 will equal zero volts because it is pulled to ground by the amplifier A through the switch $S_C$. Using a common node 24 for the electrodes 14 and 18, as shown in FIG. 1, the charge $Q_1$ stored on the capacitors $C_S$ and $C_R$ can be calculated as:

$$Q_1 = -V_{REF}C_S \qquad (1)$$

The second step of the measurement comprises the step of switching the three switches $S_1, S_2, S_C$ from their above positions. In other words, the first switch $S_1$ connects the bottom plate 12 of the reference capacitor $C_R$ to the reference voltage $V_{REF}$, the second switch $S_2$ connects the bottom plate 22 of the sensor capacitor $C_S$ to ground GND, and the coupling switch $S_C$ opens. Opening switch $S_C$ isolates the charge established on node 24 by the first setting of switches $S_1$ and $S_2$ Switching switches $S_1$ and $S_2$ results in a redistribution of the charge which has been isolated on the node 24. If the capacitance of the sensor capacitor $C_S$ is equal to the capacitance of the reference capacitor $C_R$, then voltage $V_X$ at the common node 24 will be equal to zero volts; otherwise, a non-zero voltage will be detected at the reference ground $V_X$.

The object of the second step is to apply a sufficient amount of voltage by the variable voltage source $V_{VAR}$ to the coupling capacitor to force the voltage $V_X$ to the initial value of zero volts. As a consequence of this step, the charge will be stored only on the reference capacitor $C_R$ and the coupling capacitor $C_C$ because both sides of the sensing capacitor $C_S$ are at zero volts. Thus, the total charge $Q_2$ stored on the capacitors is:

$$Q_2 = -V_{REF}C_R - V_{VAR}C_C \qquad (2)$$

Assuming that the capacitors are ideal requires that $$Q_1 = Q_2 \qquad (3)$$

because there would be a conservation of charge. Thus $$-V_{REF}C_S = -V_{REF}C_R - V_{VAR}C_C \qquad (4)$$

By setting $Q_1$ equal to $Q_2$ and solving for $V_{VAR}$ in equation (4) the amount of voltage applied by $V_{VAR}$ will be proportional to the capacitive difference of $C_S$ and $C_R$. Thus, $$V_{VAR} = [V_{REF}(C_S - C_R)]/C_C \qquad (5)$$

In practice, parasitic capacitance shown as $C_p$ is inherent in any circuit. Parasitic capacitance can be created whenever two conducting layers overlap. However, the effects of the parasitic capacitance are cancelled in the above equations because it would add the same charge term to both $Q_1$ and $Q_2$.

The signal $V_{VAR}$ is obtained during the second step by amplifier A (which may be a unity gain amplifier) and feedback circuitry including a successive approximation register 38 and a digital-to-analog converter 40. When the third switch $S_C$ is in an open position, the amplifier A operates as a voltage comparator. In other words, voltage at the inverting input terminal 34 is compared with the voltage at a non-inverting terminal 44 which, in this case, is tied to ground. If the voltage $V_X$ varies from zero volts, then the output 32 of the amplifier A saturates to a positive or negative saturation level depending on whether the voltage $V_X$ is negative or positive respectively.

Whether the voltage $V_X$ varies from zero volts depends on the capacitive values of the reference capacitor $C_R$ and the sensor capacitor $C_S$. If the capacitances are equal, then there should be no voltage difference detected by the amplifier A. If the capacitive values of the capacitors are different, then the voltage $V_X$ varies from zero volts. When the voltage $V_X$ varies from zero volts, the amplifier A detects the difference and outputs a positive or negative saturation voltage. The output voltage produced by the amplifier A is applied to the SAR 38 which applies a digital signal to the DAC 40 to generate a voltage which will null the voltage $V_X$.

The SAR generates an initial digital value which typically is half its full range of values. That digital value is converted by DAC 40 to an analog signal which is applied to the node 24 through capacitor $C_C$. Because an exact match of the analog signal to the voltage due to the capacitive difference is unlikely, $V_X$ will then be some value other than zero. Whether that value is above or below zero is sensed by the comparator to indicate whether the initial value from the SAR was too high or too low to provide an accurate offset. Based on the output from the comparator, the SAR makes another approximation which is applied to the node 24. That second approximation would typically be ¼ or ¾ the full range value depending on whether the last approximation was too high or too low. In this manner, successive approximations are made to obtain the output from the SAR and DAC which most closely offsets the voltage due to the capacitive difference. The comparator A, SAR 38 and DAC 40 thus operate as an analog-to-digital convertor which senses the change in voltage $V_X$ due to charge redistribution in the second step.

Note that the coupling capacitor $C_C$ provides for charge coupling between the output of the DAC and the input of the amplifier A. From equation 5 it can be seen that the capacitance $C_C$ acts as a voltage divider which can increase the resolution of the system in response to small differences $(C_S - C_R)$ The final digital value of the signal applied to the DAC 40 represents a voltage that will be proportional to the capacitive difference between the sensor capacitor $C_S$ and the reference capacitor $C_R$. In other words, if the SAR, DAC, and the operational amplifier are ideal, then the output voltage $V_{VAR}$ from the DAC will precisely force the voltage $V_X$ to zero volts. As a result, the output voltage $V_{VAR}$ of the DAC 40 will be the voltage required to compensate for the proportional difference in capacitances of the sensor and reference capacitors. For example, if the sensor capacitor $C_S$ were not equal to the reference capacitor $C_R$ and the voltage of the reference ground $V_X$ were less than zero volts, then a positive voltage would be required at the output of the DAC 40 to force the voltage of the reference ground $V_X$ to zero volts.

Once the voltage of the reference ground $V_X$ has been forced to zero volts, the charge observed at the common node 24 is as follows:

$$Q_2 = -V_{REF}C_R - V_{DAC}C_C \qquad (6)$$

By charge conservation, $$Q_1 = Q_2 \qquad (7)$$

so that $$-V_{REF}C_S = -V_{REF}C_R - V_{DAC}C_C \qquad (8)$$

Solving for $V_{DAC}$ $$V_{DAC} = [V_{REF}(C_S - C_R)]/C_C \qquad (9)$$

Thus, the output voltage $V_{DAC}$ of the DAC produces a voltage proportional to the capacitive difference of $C_S$ and $C_R$.

It should be noted that the reference voltage $V_{REF}$ and the ground GND could be set to any arbitrary, constant voltage values. However, it is preferred that the sensing capacitor be grounded during the second step. This is because the successive approximation routine requires an amount of time during which the sensed parameter may be varying. If the sensing capacitor were not grounded, the varying voltage $V_X$ would complicate the successive approximation routine. However, with the sensing capacitor grounded, its changing capacitance does not affect $V_X$ or the measurement at that time. The capacitance of the reference capacitor, on the other hand, is relatively stable. The charge on node 24 can be established and isolated during a very short increment of time in which switches $S_1$, $S_2$ and $S_C$ are thrown to their first step positions to quickly establish a charge which is the basis of measurement. Thereafter, the switches are thrown to their second step positions. During the longer successive approximation routine, the reference potential is applied to the more stable reference capacitor and zero potential is applied across the sensing capacitor.

The above calculations are based on the assumption that the circuit is an ideal circuit. In reality, however, the ideal circuit cannot exist. In practice, offset voltage and finite resolution of the amplifier as well as DAC error and charge injected by the switches exist.

In the present circuit, the offset voltage of the amplifier A can be ignored. If the amplifier's offset voltage is not equal to zero volts, then the voltage $V_X$ equals the amplifier's offset voltage. Since the above steps are done relative to the same voltage $V_X$, the offset voltage of the amplifier has no effect in the final output.

A potential source of error in the measurement is an amount of charge injected by the third switch $S_C$ when it is opened. That injected charge can be measured by comparing the charge stored by the capacitor $C_S$ before and after the third switch $S_C$ is opened. When the switch is opened, an initial charge $Q_{OA}$ is established on the node 24. The initial charge includes that stored on the reference capacitor $C_R$ during the first measurement step noted above and the charge $Q_{SC}$ injected from opening $S_C$. Thus, the initial charge $Q_{OA}$ is:

$$Q_{OA} = -V_{REF}C_R + Q_{SC} \qquad (10)$$

Due to $Q_{SC}$, the voltage $V_X$ will be other than zero after the switch $S_C$ is opened. Without switching $S_1$ or $S_2$, the SAR circuit then establishes a voltage $V_{VAR,CAL}$ which drives the voltage $V_X$ back to zero. The charge on node 24 is then:

$$Q_{OB} = -V_{REF}C_R - V_{VAR,CAL}C_C \quad (11)$$

As before, there will be a conservation of charge between the above steps; therefore, $$Q_{OA} = Q_{OB} \quad (12)$$

Solving for the output voltage, $V_{VAR,CAL}$ of the DAC which nulls the change in the voltage $V_X$ due to $Q_{SC}$ yields:

$$V_{VAR,CAL} = -Q_{SC}/C_C \quad (13)$$

The digital value of this output voltage would appear at the output of the SAR at the end of the calibration measurement. This voltage is proportional to the injected charge $Q_{SC}$.

Preferably, the calibration value of the output voltage $V_{VAR,CAL}$ is stored in the memory register 42. Its negative, instead of a zero output voltage $V_{VAR}$, is applied through $C_C$ during the first step of subsequent capacitive measurements. $-V_{VAR,CAL}$ applied to $C_C$ during the first measurement step establishes a charge on node 24, when it is driven to zero volts through switch $S_C$, which is subsequently offset by the equal charge injected when switch $S_C$ is opened. Subsequently, when $V_X$ is driven to zero in the second measurement step by $V_{VAR,MEAS}$:

$$V_{VAR,MEAS} = [V_{REF}(C_S - C_R)]/C_C \quad (14)$$

Because the injected charge can vary under varying test conditions, the voltage $V_{VAR,CAL}$ used to calibrate the system for charge injection can be measured periodically.

Another error which can be corrected by the circuit is that of capacitance hysteresis. Due to hysteresis, the charge on the sense capacitor, for example, might not return to zero when the voltage across the capacitor goes to zero. This charge affects the voltage measured at $V_X$. The error voltage due to hysteresis can be determined by running dual sequences. In a first measurement sequence, for example, a voltage applied to $C_R$ would be switched from zero to $V_{REF}$ as the voltage applied to $C_S$ is switched from $V_{REF}$ to zero. In a subsequent test sequence, the voltages applied to the capacitors during the two steps of the measurement would be reversed. The measured voltages in the two test sequences would then be:

$$V_{VAR,MEAS,1} = [V_{REF}(C_S - C_R)]/C_C - [Q_{SP}/C_C] \quad (15)$$

$$V_{AR,MEAS,2} = [V_{REF}(C_r - C_S)]/C_C - [Q_{RP}/C_C] \quad (16)$$

where $Q_{SP}$ and $Q_{RP}$ are residual charges due to hysteresis polarization. The sum of those two measured values is then:

$$V_P = (-Q_{SP} - Q_{RP})/C_C \quad (17)$$

Thus, the system would allow for compensation for the hysteresis error. However, in most applications the charge due to hysteresis is insignificant, and correction for charge injection due to opening of the switch $S_C$ is the only required error correction.

In the preferred embodiment, capacitive differences in small capacitances of integrated sensors are measured. With the above measuring technique, both digital and analog representations of the output voltage $V_{VAR}$, proportional to the capacitive difference between the reference capacitor $C_R$ and the sensor capacitor $C_S$ are available. The digital output voltage appears at the output of the SAR 38 while the analog ouput voltage appears at the output of the DAC 40.

The disclosed system utilizes an analog-to-digital converter in the form of comparator A, SAR 38, and DAC 40 as the voltage sensor for sensing the voltage on node 24. The analog-to-digital converter is thus an integral part of the detector circuitry. This has distinct advantages over a system which might include a simple analog amplifier as the detector followed by a separate analog-to-digital converter. In the case of a successive approximation analog-to-digital converter, an amplifier to serve as the comparator is required. In the present system, a single amplifier senses the voltage at the node 24 and senses the comparator in the analog-to-digital converter. Also, with the comparator A as an integral part of the analog-to-digital converter amplifier noise which would otherwise be amplified by an analog amplifier is eliminated. Also, the digital successive approximation register provides a convenient source of digitally stored error information such as the signal $V_{VAR,CAL}$.

The sensing capacitor $C_S$ could have been coupled to the node 24 above without a reference capacitor $C_R$. However, the use of a reference capacitor is by far preferred in most applications to minimize the effects of capacitance variations from chip to chip and such other variables as temperature.

Figure 2:
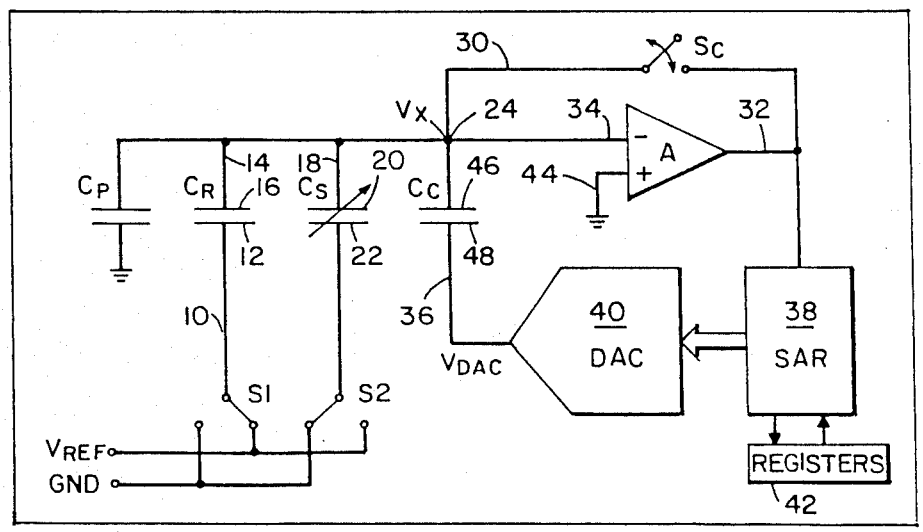
FIG. 2 is view of the circuit of FIG. 1 with the switches repositioned.

In one embodiment the reference capacitor $C_R$ remains constant while the sensor capacitor $C_S$ is allowed to vary with variations in pressure. In the initial construction of the capacitors, it is preferred that the capacitances of both capacitors be equal. With equal capacitances, the reference capacitor $C_R$ and the sensor capacitor $C_S$, which are made under the same conditions as well as on the same chip, will tend to track or drift together with variations in temperature. Thus, the measured capacitive differences between the capacitors are independent of fluctuations resulting from variations in temperature and the like. In that embodiment, the test sequence discussed above with respect to FIGS. 1 and 2 can be used to advantage in that the voltage applied to $C_S$ during the SAR routine is zero.

Figure 3:
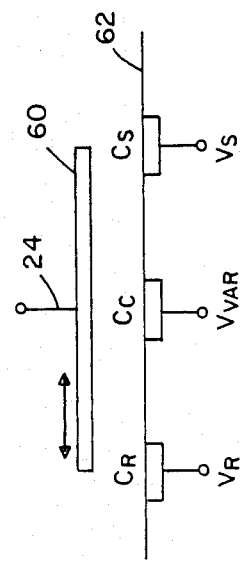
FIG. 3 illustrate a sensor in lateral movement of a plate results in differential capacitance charges.
Figure 5:
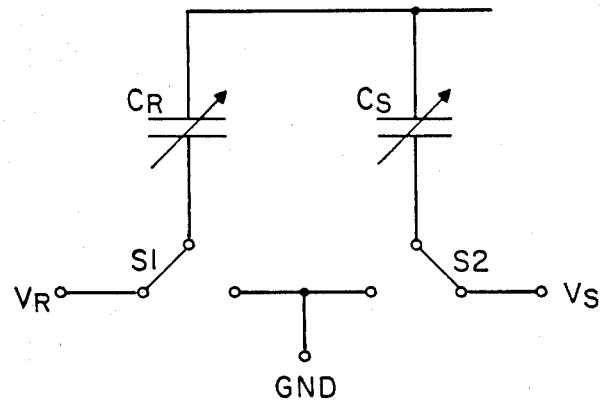
FIG. 5 is an illustration of an alternative switch arrangement for applying reference voltages to the capacitors of FIGS. 1 and 2.

In other sensors, the capacitors $C_R$ and $C_S$ may both vary with a sensed parameter and e coupled differentially to the node 24. Such a sensor has, for example, been suggested for detection of shear stress. An illustration of the structure of the capacitors is illustrated in FIG. 3. In that device, the upper plates of the capacitors $C_R$ and $C_S$ are formed on a laterally moving plate 60, and the opposite plates are fixed to a substrate 62. As the plate 60 moves to the right, for example, the effective area of the capacitor $C_S$ increases and the effective area of the capacitor $C_R$ decreases. The capacitances of the two capacitors thus vary oppositely due to lateral displacement. A particularly advantageous measurement sequence for that sensor is to initially apply positive and negative reference voltages $V_R$ and $V_S$ (FIG. 5) to respective capacitors $C_R$ and $C_S$. Then, when the switch $S_C$ is open, the applied voltages are switched to zero for the successive approximation routine. The resultant voltage $V_{VAR,MEAS}$ which nulls the voltage $V_X$ is then, $$V_{VAR,MEAS} = \pm V_{REF}(C_R - C_S)/C_C \quad (18)$$

Note that a different sequence utilizing different voltages has yielded the same results as before. This sequence has particular advantage where both capacitors are sensor capacitors because it allows both to have zero voltage applied during the SAR routine.

The switching sequence can be completely generalized. The voltages are $V_p$ = voltage at bottom plate of $C_p$
$V_{Rn}$ = voltage at bottom plate of $C_R$ in Step n
$V_{Sn}$ = voltage at bottom plate of $C_S$ in Step n
$V_{VAR,CAL}$ = voltage applied to $C_C$ to calibrate
$V_{VAR,MEAS}$ = voltage applied to $C_C$ in measurement
$V_+$ = voltage reference at the positive input terminal of the comparator
$V_x$ = voltage at the sensitive node 24
$V_{os}$ = offset voltage of the amplifier In step 1, $S_C$ is closed and the specified voltages are applied. It is assumed that $V_+$ and $V_p$ never change. With the feedback loop closed, $V_x$ is forced to $V_+ + V_{os}$. The charge on the top node becomes $$Q_1 = (V_+ + V_{os} - V_p)C_P + (V_+ + V_{os} - V_{R1})C_R +$$
$$(V_+ + V_{os} - V_{S1})C_S + (V_+ + V_{os} - V_{VAR,CAL})C_C$$

In step 2, the switch is opened and the SAR/DAC feedback loop forces $V_x$ back to $V_+ + V_{os}$. The expression for the charge at the top node becomes $$Q_2 = (V_+ + V_{os} - V_p)C_P + (V_+ + V_{os} - V_{R2})C_R +$$
$$(V_+ + V_{os} - V_{S2})C_S + (V_+ + V_{os} - V_{VAR,MEAS})C_C$$

If additional charge $Q_{other}$ other than from the capacitors is to be taken into account (such as MOS switch charge injection or residual polarization), then by charge conservation, $$Q_1 + Q_{other} = Q_2$$

It is easily seen that all terms involving $C_p, V_{os}$, and $V_+$ cancel. Solving for $V_{DAC,MEAS}$ yields $$V_{VAR,MEAS} = [(V_{R1} - V_{R2})C_R + (V_{S1} - V_{S2})C_S]/C_C + V_{VAR,CAL} - Q_{other}/C_C \quad (26)$$

This is the general form of the measurement. If the difference in capacitance between $C_R$ and $C_S$ is desired, then appropriate choices of voltages can be chosen. To eliminate the effect of $Q_{other}$, $V_{DAC,CAL}$ must be chosen to equal $Q_{other}/C_C$. But a priori we do not know $Q_{other}$. But from equation 26, if $V_{VAR,CAL}$ is set to zero, $V_{R1} = V_{R2}$, and $V_{S1} = V_{S2}$, then we can measure the value $$-Q_{other}/C_C$$

Setting $V_{VAR,CAL}$ to the negative of this value and choosing appropriate values of $V_{R1}$, $V_{R2}$, $V_{S1}$, and $V_{S2}$, equation 26 will yield a voltage proportional to the difference of $C_R$ and $C_S$ In fact, $V_{VAR,CAL}$ can be set to any value. If it is set equal to the negative of the value obtained by measuring the charge injection plus the capacitive mismatch, then complete cancellation can result, and the measured voltage will be zero. This is apparent from the equation. If we can independently measure the terms in equation 26, then they can each be cancelled by adjusting the value of $V_{VAR,CAL}$. All or some of the terms can be cancelled by changing $V_{VAR,CAL}$.

Equation 22 can easily be derived from the general form of equation 26. For the measured DAC voltage to be proportional to the difference in $C_R$ and $C_S$, the following relation between the applied voltages must be true:

$$(V_{R1} - V_{R2}) = -(V_{S1} - V_{S2}) \neq 0$$

If the only voltages available are $\pm V_{REF}$ and 0, the total possible number of switching sequences is ten. The following table shows different values of $V_{R1,2}$ and $V_{S1,2}$ so that a difference in capacitance can be measured. Notice that sequences 1-8 yield the same form as equation 22. Sequences 9 and 10 have an extra constant of 2 since both $\pm V_{REF}$ are used throughout the steps. Dual sequences suitable for measuring voltage change due to hysteresis are sequences (1,5), (2,6), (3,7), (4,8) and (9,10).

| Sequence | SWITCHING SEQUENCES | | | |
|---|---|---|---|---|
| | $V_{R1}$ | $V_{S1}$ | $V_{R2}$ | $V_{S2}$ |
| 1 | 0 | $V_{REF}$ | $V_{REF}$ | 0 |
| 2 | 0 | 0 | $V_{REF}$ | $-V_{REF}$ |
| 3 | 0 | 0 | $-V_{REF}$ | $V_{REF}$ |
| 4 | 0 | $-V_{REF}$ | $-V_{REF}$ | 0 |
| 5 | $V_{REF}$ | 0 | 0 | $V_{REF}$ |
| 6 | $V_{REF}$ | $-V_{REF}$ | 0 | 0 |
| 7 | $-V_{REF}$ | $V_{REF}$ | 0 | 0 |
| 8 | $-V_{REF}$ | 0 | 0 | $-V_{REF}$ |
| 9 | $V_{REF}$ | $-V_{REF}$ | $-V_{REF}$ | $V_{REF}$ |
| 10 | $-V_{REF}$ | $V_{REF}$ | $V_{REF}$ | $-V_{REF}$ |

Figure 4:
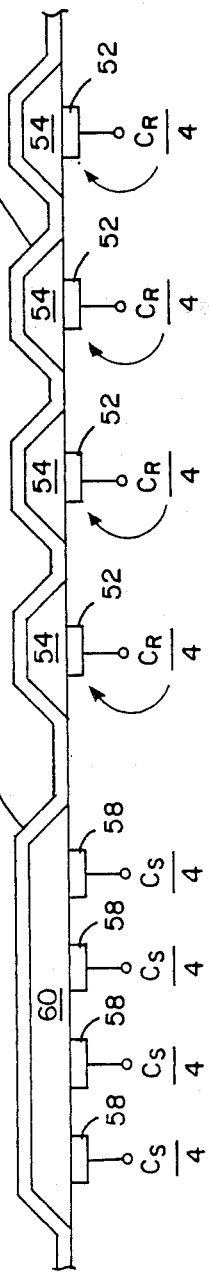
FIG. 4 is a cross sectional view showing the construction of a reference capacitor and a sensor capacitor respectively on a chip embodying the present invention.

FIGS. 4 shows an embodiment of the reference capacitor $C_R$ and the sensor capacitor $C_S$ on a chip for pressure sensing applications. To the right, upper plate 50 overlays four lower plates 52. The plates 50 and 52 are made of conductive material. Four air gaps 54 separate the upper and lower plates and 52. Since an air capacitor is a function of space and area, four parallel capacitors $C_R/4$ are formed. The sum of the capacitances equals the total capacitance of the reference capacitor $C_R$.

To the left of FIG. 4, an upper plate 56 overlays four lower plates 58. For this capacitor $C_S$, a single air gap 60 separates the upper and lower plates 56 and 58. Again, four capacitors $C_S/4$ are in parallel with each other, and the sum of the capacitances of the four capacitance values equal the total capacitance of the sensor capacitor $C_S$.

The construction difference between the sensor capacitor $C_S$ and the reference capacitor $C_R$ is that the upper plate 56 of each of the four capacitors $C_R/4$ of the reference capacitor $C_R$ is mechanically more rigid than the upper plate 56 of the sensor capacitor $C_S$. Thus, the upper plate 50 of the reference capacitor will not deform as easily to pressure variations as will the upper plate 56 of the sensor capacitor $C_S$. The actual design of the capacitors should take into consideration the amount of pressure variations that are sought to be detected. Preferably, the deformation of the upper plate of the sensor capacitor is limited to 10 percent.

Although it is desirable to match the two capacitors as closely as possible, capacitance difference between the two structures will occur. Variations of mismatches from chip to chip can be calibrated by an initial test which initially measures the capacitive difference by the method described above at one or more known sensed levels. The initial capacitive difference measured is in terms of a voltage variation and that variation can be stored in a non-volatile register 42 for use in all subsequent measurement. This variation can be included in the calibration voltage $V_{VAR,CAL}$ in measurement. Thus, any mismatches in manufacture can be nullified during actual use. This avoids laser trimming, which is often used to perfect matches in manufacture. Single or multiple point calibration is possible.

While the invention has been particularly shown and described with reference to the preferred emobidments thereof, it will be understood by those who are skilled in the art that there are changes in form and detail that may be made without departing from the spirit and scope of the invention as defined by the appended claims. For example, by appropriately choosing the values of the reference volta $V_{REF}$ and the coupling capacitor $C_C$, the maximum dynamic range of the DAC can be utilized.

The DAC 40 may also be coupled back to the non-inverting input of the comparator A. Such an arrangement is less desirable, however, because the capacitor $C_C$ serves as a natural voltage divider. Also, by always bringing $V_X$ back to zero, any possible changes in voltage offset of the comparator due to variations in the input voltage are overcome.

The switch $S_C$ could also be coupled to ground rather than to the output of the comparator. However, error which would then result from the voltage offset of the comparator would have to be reckoned with using the approach suggested for nullifying injected charge. Also, the voltage offset could be large and be beyond the capture range of the analog-to-digital convertor.

Although the invention has been described particularly with respect to measurements which provide the difference in capacitances between two matched capacitors, more complex sensing capacitor arrangements including multiple capacitors connected to provide both sums and differences may be designed.

We claim:

1. A sensor comprising a sensing capacitor, the capacitor of which varies with a parameter to be sensed, the system further comprising:
   means for isolating a definite amount of charge on a node electrically connected to the sensing capacitor;
   means for modifying the distribution of said definite charge on the node by modifying at least a voltage applied to the sensing capacitor;
   a comparator for sensing the voltage on the node; and
   successive approximation means or receiving an output from the comparator and applying a feedback signal to an input to the comparator to determine a change in voltage on the node resulting from the modified distribution of the charge.

2. A sensor system as claimed in claim 1 wherein an initial potential is applied to the sensing capacitor to establish the definite amount of charge, and the means for modifying the distribution of charge applies ground potential to the sensing capacitor.

3. A sensor system as claimed in claim 1 wherein the feedback signal is applied through a coupling capacitor to the node and the node is connected to the inverting input of the comparator.

4. A sensor system as claimed in claim 1 wherein the means for isolating comprising a switch connected across the comparator.

5. A sensor system as claimed in claim 1 further comprising calibration means for storing a calibration signal indicative of a change in voltage on the node, which change results from other than change in capacitance of the sensing capacitor, to correct a determined change in voltage.

6. A sensor system as claimed in claim 5 wherein the means for isolating the charge includes a switch which injects charge to the node, and the calibration means senses, by the comparator and successive approximation means, the change in voltage at the node when the switch is opened without modifying the distribution of charge on the node.

7. A sensor system as claimed in claim 5 wherein the feedback signal to the comparator is applied through a coupling capacitor to an inverting input of the comparator and the determined change in voltage is corrected by applying a calibration voltage to the coupling capacitor.

8. A sensor system as claimed in claim 1 further comprising a reference capacitor connected to the node and wherein the means for modifying modifies the voltage applied to each of the sensing capacitor and reference capacitor.

9. A sensor system as claimed in claim 8 wherein an initial potential is applied to the sensing capacitor to establish the definite amount of charge, and the means for modifying the distribution of charge applies ground potential to the sensing capacitor.

10. A sensor system as claimed in claim 8 wherein the reference capacitor also varies with the parameter to be sensed.

11. A sensor system as claimed in claim 10 wherein positive and negative voltages are applied to the reference and sensing capacitors to establish the amount of charge on the node, and the distribution of the charge is modified by applying ground potential to each of the reference capacitor and sensing capacitor.

12. A sensor system as claimed in claim 8 further comprising calibration means for storing a calibration signal indicative of a change in voltage on the node, which change results from other than change in capacitance of the sensing capacitor, to correct the determined change in voltage.

13. A sensor system as claimed in claim 12 wherein the means for isolating the charge includes a switch which inject charge to the node, and the calibration means senses, by the comparator and successive approximation means, the change in voltage at the node when the switch is opened without modifying the distribution of charge on the node.

14. A sensor system as claimed in claim 12 further comprising means for isolating the definite amount of charge and modifying the distribution of charge in dual sequences such that the difference between the changes in voltage on the node during the two sequences are indicative of capacitance hysteresis.

15. A sensor system comprising a sensor capacitor, the capacitance of which varies with a parameter to be sensed, the system further comprising:

means for isolating a definite amount of charge on a node electrically connected to the sensing capacitor;

means for modifying the distribution of said definite charge on the node by modifying at least a voltage applied to the sensing capacitor;

a detector for determining change in voltage on the node; and calibration means connected to the detector for storing a calibration signal indicative of a change in voltage on the node, which change results from other than change in capacitance of the sensing capacitor, and for correcting the determined change in voltage based on the calibration signal.

16. A sensor system as claimed in claim 15 wherein the means for isolating the charge includes a switch which injects charge to the node, and the calibration means senses a change in voltage at the node when the switch is opened.

17. A sensor system as claimed in claim 15 further, comprising a coupling capacitor connected to the node and wherein the calibration signal is applied across the coupling capacitor to the node as the definite amount of charge is isolated on the node.

18. A sensor system as claimed in claim 15 wherein the calibration signal is a function of a mismatch between the sensing capacitor and a reference capacitor connected to the node.

19. A sensor system as claimed in claim 15 further comprising a reference capacitor connected to the node and wherein the means for modifying modifies the voltage applied to each of the sensing capacitor and reference capacitor.

20. A sensor system as claimed in claim 19 wherein the reference capacitor also varies with the parameter to be sensed.

21. A sensor system as claimed in claim 20 further comprising means for isolating the definite amount of charge and modifying the distribution of charge in dual sequences such that the difference between the changes in voltage on the node during the two sequences are indicative of capacitance hysteresis.

22. A sensor system comprising a sensing capacitor, the capacitance of which varies with a parameter to be sensed, the system further comprising:
a node electrically connected to the sensing capacitor;
a reference capacitor connected to the node;
a comparator for sensing the voltage on the node;
a switch in parallel with the comparator for isolating a definite amount of charge on the node;
means for modifying the distribution of said definite charge on the node by modifying voltages applied to the sensing capacitor and reference capacitor;
a coupling capacitor connected to the node;
digital successive approximation means for receiving an output from the comparator and applying a feedback signal through the coupling capacitor to null and thus determine a change in voltage on the node resulting from the modified distribution of charge; and
calibration means connected to the successive approximation means for storing a calibration signal indicative of a change in voltage on the node, which change results from other than change in capacitance of the sensing capacitor, to correct the determined change in voltage.

23. The method of sensing a parameter which results in change in capacitance of at least one sensing capacitor comprising:
isolating a charge on a node electrically connected to the sensing capacitor;
modifying the distribution of said charge on the node by modifying at least a voltage applied to the sensing capacitor; and
determining change in voltage resulting from the modified distribution of charge by comparing in a comparator the voltage on the node to a reference and, responsive to an output from the comparator, performing successive approximations to generate a feedback signal applied to an input to the comparator.

24. A method as claimed in claim 23 wherein an initial potential is applied to the sensing capacitor to establish the amount of charge, and the means for modifying the distribution of charge applies ground potential to the sensing capacitor.

25. A method as claimed in claim 23 wherein the successive approximations are applied through a coupling capacitor to the node, and the node is connected to the inverting input of the comparator.

26. A method as claimed in claim 23 further comprising the step of storing a calibration signal indicative of a change in voltage on the node, which change results from other than change in capacitance of the sensing capacitor, to correct a determined change in voltage.

27. A method as claimed in claim 26 wherein the charge is isolated by a switch which inject charge to the node and further comprising the steps of sensing the change in voltage at the node when the switch is opened and correcting the determined change in voltage for injected change.

28. A method as claimed in claim 27 further comprising applying a calibration voltage through a coupling capacitor to the node as the charge is isolated.

29. A method as claimed in claim 23 further comprising modifying the voltage applied to each of the sensing capacitor and a reference capacitor connected to the node.

30. A method as claimed in claim 29 wherein positive and negative voltages are applied to the reference and sensing capacitors to establish the amount of charge on the node and distribution of the charge is modified by applying ground potential to each of the reference capacitor and sensing capacitor.

31. A method as claimed in claim 29 wherein an initial potential is applied to the sensing capacitor to establish the definite amount of charge and the distribution of charge is modified by applying ground potential to the sensing capacitor.

32. A method as claimed in claim 29 further comprising storing a calibration signal indicative of a change in voltage on the node, which charge results from other than change in capacitance of the sensing capacitor, and with the calibrating signal, correcting the change in voltage determined in the step of determining.

33. A method as claimed in claim 32 wherein the the charge is isolated by a switch which injects charge to the node, and the calibration means senses, by the comparator and successive approximation means, the change in voltage at the node when the switch is opened without modifying the distribution of charge on the node.

34. A method as claimed in claim 32 further comprising isolating the amount of charge and modifying the distribution of charge in dual sequences and determining the capacitance hysteresis based on the difference between the changes in voltage on the node during the two sequences.

35. A method of sensing a parameter which results in change in capacitance of at least one sensing capacitor comprising:
- isolating a charge, on a node electrically connected to the sensing capacitor;
- modifying the distribution of said charge on the node by modifying at least a voltage applied to the sensing capacitors;
- determining the change in voltage on the node; and
- correcting the determined change in voltage based on a calibration signal indicative of a change in the voltage on the anode which results from other than change in capacitance of the sensing capacitor.

36. A method as claimed in claim 35 wherein the charge is isolated by a switch which inject charge to the node, and the calibration means senses, by the comparator and successive approximation means, the change in voltage at the node when the switch is opened without modifying the distribution of charge on the node.

37. A method as claimed in claim 35 further comprising modifying the voltage applied to each of the sensing capacitor and a reference capacitor connected to the node.

38. A method as claimed in claim 37 further comprising isolating the amount of charge and modifying the distribution of charge in dual sequences and determining capacitance hysteresis based on the difference between the changes in voltage on the node during the two sequences.

* * * * *

UNITED STATES PATENT AND TRADEMARK OFFICE
CERTIFICATE OF CORRECTION

PATENT NO. : 4,860,232

DATED : August 22, 1989

INVENTOR(S) : Hae-Seung Lee, Roger T. Howe and Joseph T. Kung

It is certified that error appears in the above identified patent and that said Letters Patent is hereby corrected as shown below:

Column 11:
    In claim 1, at lines 49-50, "capacitor" should be "capacitance".

In claim 1, at line 59, "or" should be "for".

Column 12:
    In claim 6, at line 16, "injects" should be "may inject".

In claim 13, at line 55, "injects" should be "may inject".

Column 13:
    In claim 16, at line 17, "injects" should be "may inject".

Column 14:
    In claim 27, at line 31, "inject" should be "may inject".

In claim 27, at line 35, "change" should be "charge".

In claim 32, at line 56, "charge" should be "change".

In claim 33, at line 61, "injects" should be "may inject".

Column 15:
    In claim 35, at line 15, "anode" should be "node".

Column 16:
    In claim 36, at line 2, "inject" should be "may inject".

Signed and Sealed this

First Day of October, 1991

Attest:

HARRY F. MANBECK, JR.

Attesting Officer      Commissioner of Patents and Trademarks